United States Patent
Peng (10) Patent No.: US 7,426,116 B1
(45) Date of Patent: Sep. 16, 2008

(54) RETENTION DEVICE

(75) Inventor: Ying-Chao Peng, Taipei (TW)

(73) Assignee: Inventec Corporation, Taipei (TW)

( * ) Notice: Subject to any disclaimer, the term of this patent is extended or adjusted under 35 U.S.C. 154(b) by 0 days.

(21) Appl. No.: 11/870,006

(22) Filed: Oct. 10, 2007

(51) Int. Cl.
*H05K 5/00* (2006.01)

(52) U.S. Cl. .................................. 361/756; 361/727
(58) Field of Classification Search .............. 361/807, 361/810, 756, 727, 741, 801, 802, 797, 790, 361/769; 174/138
See application file for complete search history.

(56) References Cited

U.S. PATENT DOCUMENTS 5,490,038 A * 2/1996 Scholder et al. ............ 361/759
6,982,878 B2 * 1/2006 Chen et al. ................. 361/801
7,151,677 B2 * 12/2006 Le et al. ..................... 361/807

* cited by examiner

*Primary Examiner*—Hung S Bui
(74) *Attorney, Agent, or Firm*—Morris, Manning & Martin LLP; Tim Tingkang Xia, Esq.

(57) ABSTRACT

A retention device is applied in an electronic device. The electronic device has a case and a circuit board, and the circuit board can shifts relative to the case along an integrate direction or a release direction. The retention device includes a first fastener, a latching member, and a second fastener. The first fastener is movably disposed on the case, and the latching member is mounted on one side of the circuit board. When the latching member shifts with the circuit board along the integrate direction to push the first fastener to shift, the latching member is limited by the stopping of the first fastener, and the first fastener shifts due to the pushing of the second fastener. The latching member is separated from the first fastener along the release direction, such that the circuit board is fixed on or detached from the case.

8 Claims, 8 Drawing Sheets

RETENTION DEVICE

BACKGROUND OF THE INVENTION

1. Field of Invention

The present invention relates to a retention device. More particularly, the present invention relates to a retention device capable of locking and fixing a circuit board without bolts.

2. Related Art

Currently, with the rapid development of science, technology and information, a computer device has become a quite popular electronic device. In the current market, computer devices, such as desktop computers, notebook computers, or servers, are all provided with a mainboard therein as a kernel member of a compute system, so that computer peripheral hardware, such as a central processing unit (CPU), a memory module, and a PCI card, electrically connected to the mainboard may perform default functions smoothly.

The mainboard is usually fixed as follows. A plurality of conductive bosses is formed on a case of a computer device as fixing means, and a plurality of through holes corresponding to the conductive bosses is formed in the mainboard. The mainboard is laid on the conductive bosses to keep a suitable distance from the case, and then, a plurality of bolts penetrates the through holes of the mainboard, and are locked on the conductive bosses, with a result that the mainboard is suspended by the aid of the conductive bosses, and leg contacts on the back side of the mainboard are prevented from directly contacting the case to cause a short circuit.

With regard to the conventional method of locking and fixing the mainboard by the conductive bosses, when the mainboard is being mounted and dismounted, a user has to lock and release the bolts one by one with the same actions, which is quite complicated and time-consuming and also inconvenient in practical use. Furthermore, the present electronic device is required to be light, thin, short, and small, but too many conductive bosses will occupy more area of the mainboard. The circuit layout on the mainboard cannot be achieved easily, and the volume of the whole electronic device cannot be microminiaturized, either.

Figure 1:
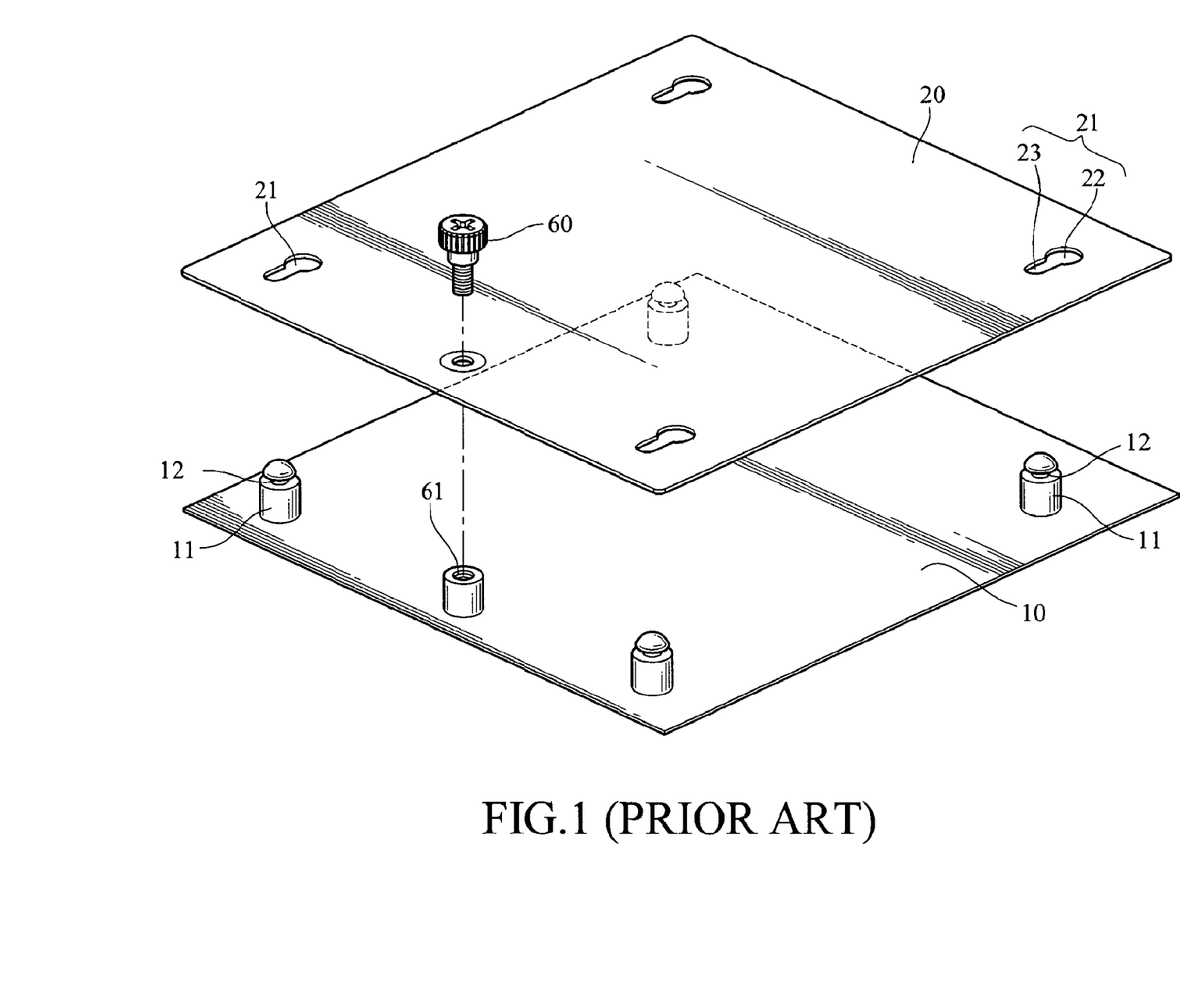
FIG. 1 is an exploded view of the conventional art.

In recent years, a thumb screw emerges is developed, which may be screwed directly by hand, so as to serve as a positioning means for fixing the mainboard. As shown in FIG. 1, it is a schematic view of fixing a circuit board 20 on a case 10 using a thumb screw 60 under a normal circumstance. The case 10 has a plurality of positioning posts 11 with a screw hole 61, in which a neck 12 is formed around the middle portion of each positioning post 11. The circuit board 20 has a plurality of positioning holes 21 corresponding to the positioning posts 11. Each of the positioning holes 21 shapes like a calabash and has a wide section 22 and a narrow section 23, and the front end of each positioning post 11 penetrates the wide section 22 of the positioning hole 21. In this manner, the circuit board 20 may slide on the case 10 by the positioning posts 11, so that the narrow section 23 of each of the positioning hole 21 is engaged into each of the neck 12 of the positioning posts 11. Subsequently, the circuit board 20 may be fixed on the case 10 merely by making the thumb screw 60 penetrate the circuit board 20 and screw it into the screw hole 61.

The method of locking the circuit board on the mainboard by using the thumb screw may significantly reduce the quantity of the conductive bosses and solve the problems caused by the method of locking the mainboard by the conductive bosses. However, the method of locking the mainboard by the thumb screw is still a locking method by screwing, and through this method, the process of mounting and dismounting the mainboard is too complicated and time consuming. Furthermore, the cost of the thumb screw is also higher than that of the conventional bolt, thereby causing a high manufacturing cost.

For persons skilled in the art, it is an urgently problem that how to truly fix the mounting position of the mainboard in a screwless manner, and enable users to mount and dismount the mainboard rapidly and conveniently.

SUMMARY OF THE INVENTION

In view of the aforementioned problems, the present invention provides a retention device, so as to solve the problems in the conventional art that, because the mainboard is mounted and dismounted by a screwing manner, the volume of an electronic device cannot be microminiaturized, and the mounting and dismounting period is too complicated and time-consuming and achieves the locking purpose by using a tool, thereby causing a high manufacturing cost and inconvenience in operation.

The retention device provided by the present invention is applied to an electronic device. The electronic device has a case and a circuit board, and the circuit board may shifts relative to the case along a integrate direction or a release direction, such that the circuit board gets caught by the case or be detached from the case, and is fixed on the case by the retention device.

The retention device includes a first fastener, a first elastic member, a latching member, and a second fastener. The first fastener is movably disposed on the case, and moves between a fixing position and a releasing position. A stopping portion and at least one first pushing portion are disposed at one side of the first fastener, and a moving direction of the first fastener forms an angle with the integrate direction or the release direction. The first elastic member is disposed on the case and leans against the first fastener, so as to normally maintain the first fastener at a fixing position. The latching member is mounted on one side of the circuit board facing to the first fastener. The latching member shifts with the circuit board along the integrate direction, the latching member pushes the first fastener to shift, and is then limited by the stopping portion, such that the circuit board is positioned on the case.

The second fastener is movably disposed on the case and adjoins the first fastener, and a moving direction of the second fastener and the moving direction of the first fastener are offset. At least one second pushing portion contacting with the first pushing portion is disposed at one side of the second fastener, and a contacting surface of the first pushing portion and the second pushing portion forms an angle with the moving direction of the first fastener. The second fastener can selectively shift relative to the first fastener, so as to make the second pushing portion push the first pushing portion, and to make the first fastener shift from the fixing position to the releasing position, such that the latching member is separated from the first fastener along the release direction, and the circuit board is detached from the case.

The efficacies of the present invention is that, the circuit board of the electronic device can be stably mounted on the case through the stopping of the first fastener, and can be detached from the case by using the second fastener to push the first fastener. Users may mount or dismount the circuit board more easily and rapidly without screwing or unscrewing a plurality of screws, and may fix the position of the circuit board in a screwless manner.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below for illustration only, and thus are not limitative of the present invention, and wherein.

DETAILED DESCRIPTION OF THE INVENTION

The retention device of the present invention is applied in an electronic device, which like a computer device provided with a circuit board to execute actions, such as desktop computers, notebook computers, and severs. In the following detailed description of the present invention, the notebook is used as a preferred embodiment of the present invention. The accompanied drawings are merely provided for reference and illustration and are not intended to limit the present invention.

Figure 2:
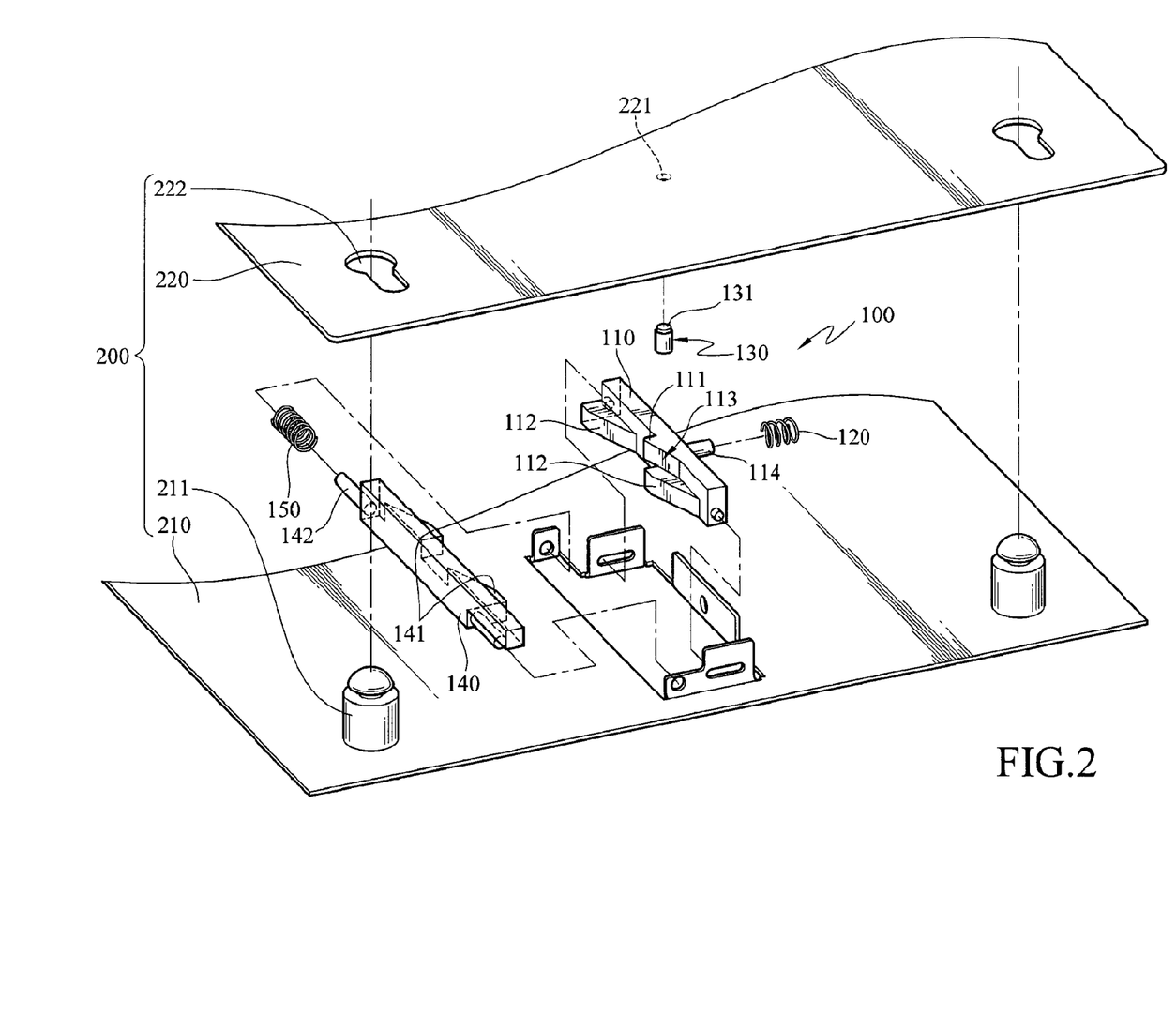
FIG. 2 is a exploded view of the present invention.

FIG. 2 is an exploded view of the present invention. The retention device 100 disclosed in the present invention is applied in an electronic device 200. The electronic device 200 includes a case 210 and a circuit board 220, the case 210 has at least one combination post 211 thereon, and the circuit board has at least one combination hole 221 formed therein. The combination post 211 is a post with a top size slightly larger than the body size, and the combination hole 221 is a gourd shaped structure formed of a large hole and a small hole extending from the circumference of the large hole, so as to accommodate the top of the combination post 211. The circuit board 220 may shift relative to the case 210 along the combining direction or the release direction, so that the combination post 211 and the combination hole 221 are engaged with each other, and the circuit board 220 may be caught on or detached from the case 210.

Referring to FIG. 2, the retention device 100 of the present invention includes a first fastener 110, a first elastic member 120, a latching member 130, and a second fastener 140. The first fastener 110 is movably mounted on the case 210 and moves between a fixing position and a releasing position, and the moving direction of the first fastener 110 is perpendicular to the integrate direction or the release direction of the circuit board 220. A stopping portion 111 and two first pushing portions 112 are disposed at one side of the first fastener 110, and a first pin 114 is disposed at the other side of the first fastener 110. A guide chamfer 113 is disposed on the first fastener 110 near the stopping portion 111.

The first elastic member 120 is sleeved on the first pin 114, with one end leaning against the case 210, and the other end leaning against one side of the first fastener 110. The first elastic member 120 is used to push the first fastener 110, so as to normally maintain the first fastener 110 at the fixing position.

A bump 131 is disposed at one end of the latching member 130, and a combination portion 222 corresponding to the bump 131 is disposed at one side of the circuit board 220 facing to the first fastener 110. The bump 131 and the combination portion 222 are engaged with each other, such that the latching member 130 is mounted on a side of the circuit board 220 facing to the first fastener 110.

The second fastener 140 is movably disposed on the case 210 and adjoins the first fastener 110. The second fastener 140 can shift along the integrate direction or the release direction, such that the moving direction is offset to the moving direction of the first fastener 110. Two second pushing portions 141 are disposed at one side of the second fastener 140, and are in contact with the first pushing portions 112. A contacting surface of the first pushing portion 112 and the second pushing portion 141 forms an angle with the moving direction of the first fastener 110. An accommodation space is formed between the first fastener 110 and the second fastener 140, for accommodating the latching member 130 therein.

In addition, as shown in FIG. 2, the retention device 100 of the present invention further includes a second elastic member 150. A second pin 142 is disposed on the other side of the second fastener 140, and the second elastic member 150 is sleeved on the second pin 142, with one end leaning against a combination wall of the case 210, and the other end leaning against one side of the second fastener 140, such that the second elastic member 150 normally pushes the second fastener 140.

Figure 3A:
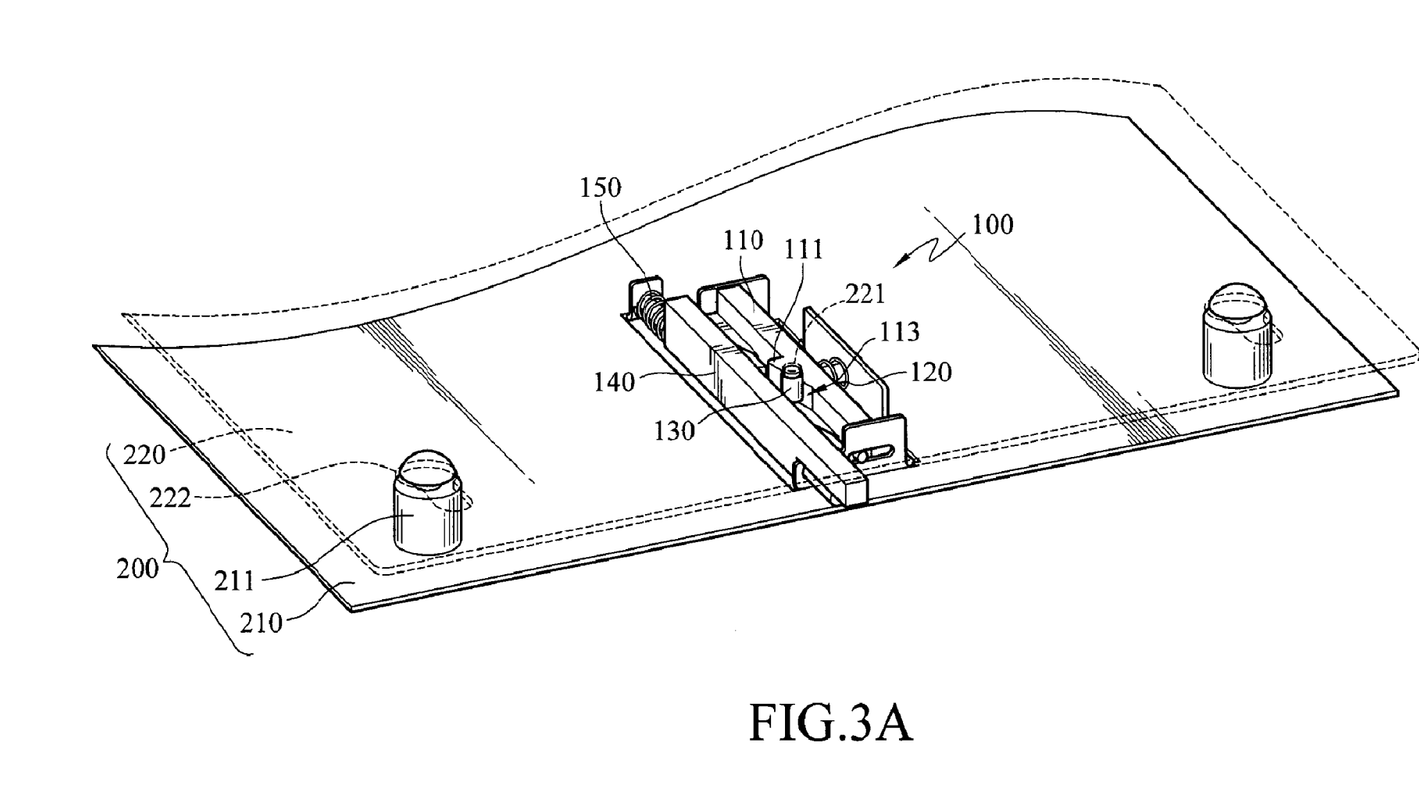
FIG. 3A is a perspective view of the present invention in a mounting state.
Figure 3B:
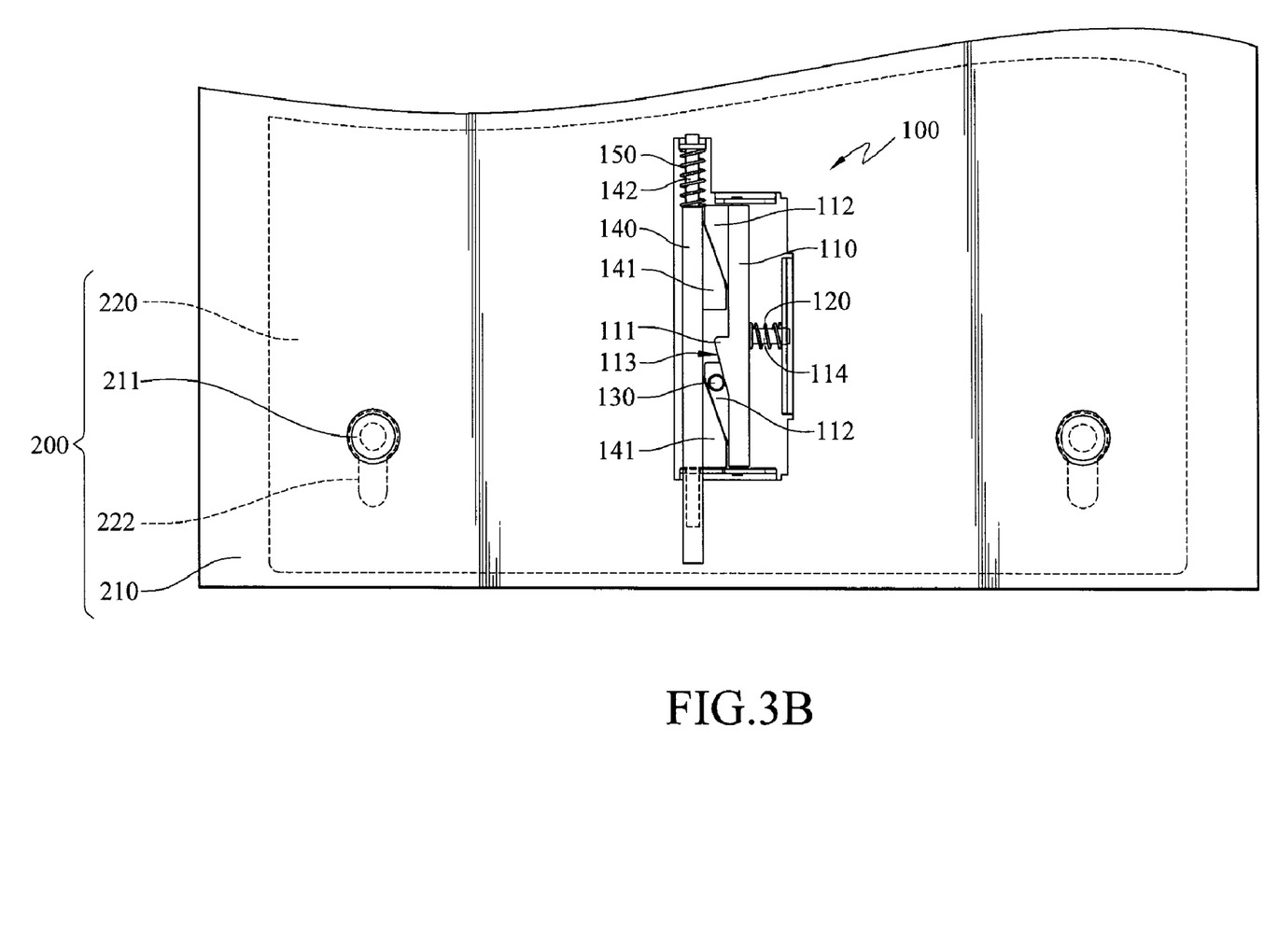
FIG. 3B is a top view of the present invention in the mounting state.

FIGS. 3A and 3B are a perspective view and a top view of the circuit board in a mounting state. When the latching member 130 shifts with the circuit board 220 along the integrate direction, the latching member 130 pushes the first fastener 110 to shift through the guide of the guide chamfer 113, and the first elastic member 120 is compressed to deform at the same time.

Figure 4A:
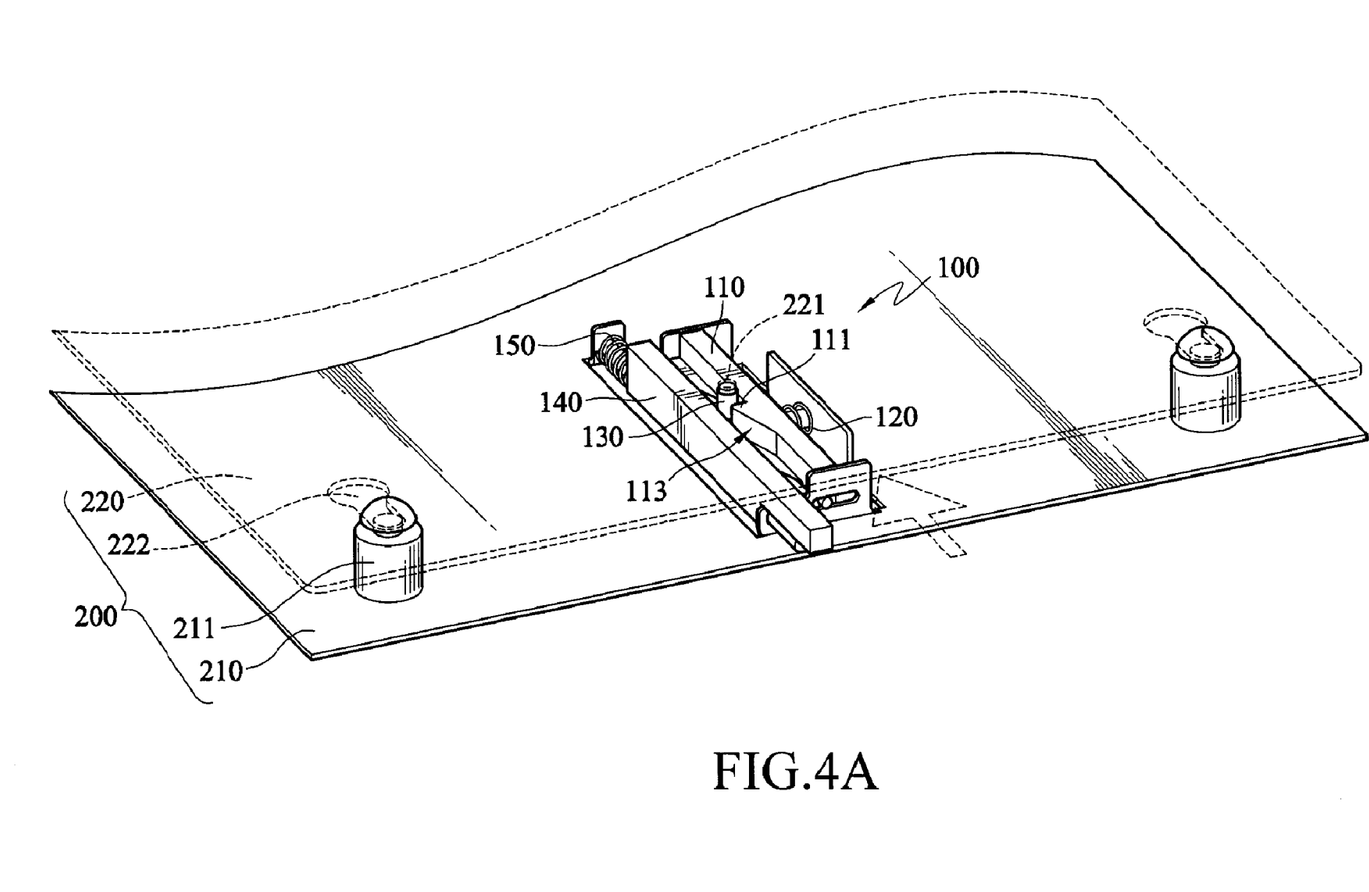
FIG. 4A is a perspective view of the present invention in a combined state.
Figure 4B:
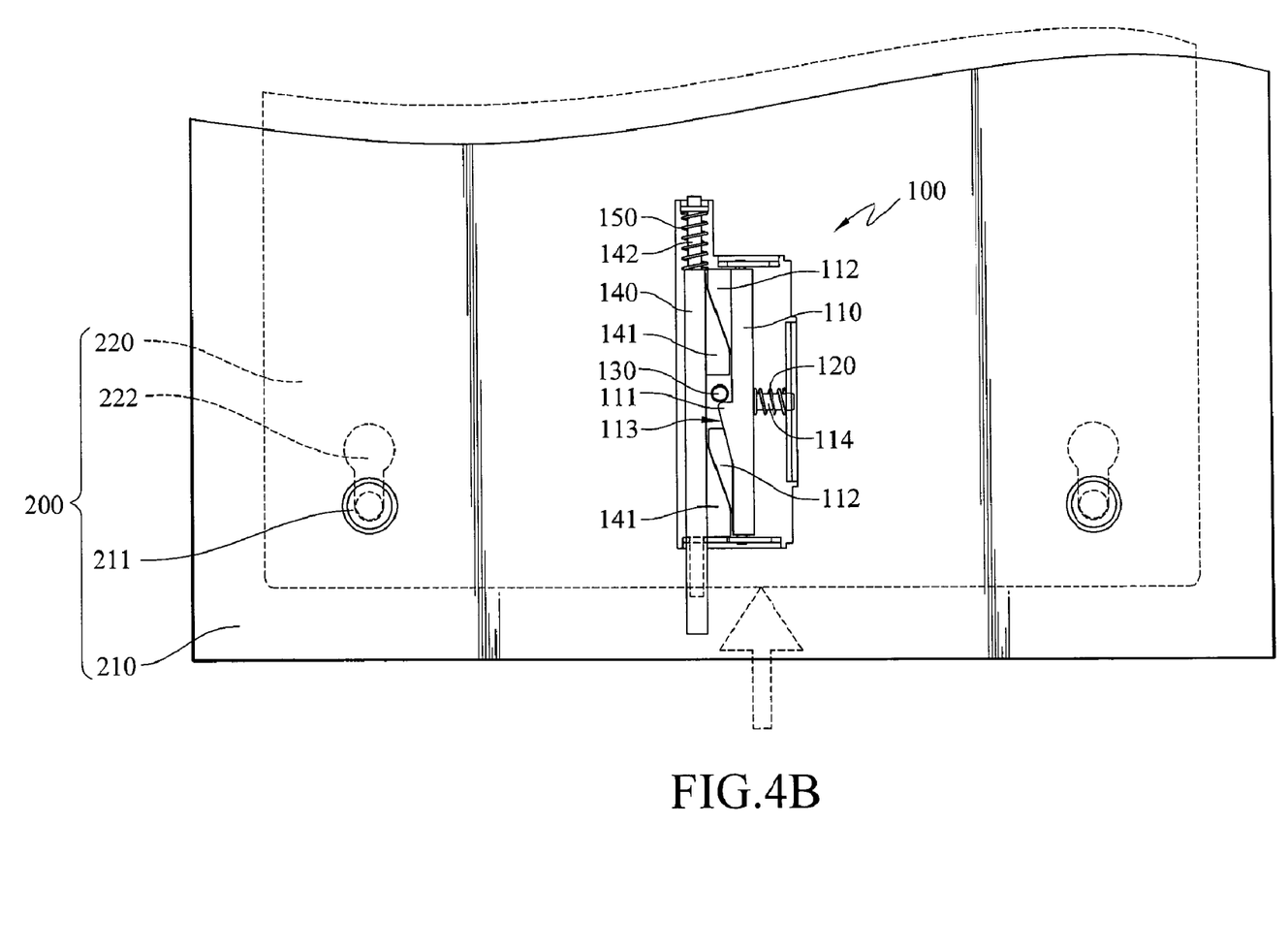
FIG. 4B is a top view of the present invention in the combined state.

FIGS. 4A and 4B are schematic views of the circuit board during a combined state. The latching member 130 continuously shifts towards the integrate direction, and pushes the first fastener 110 from the fixing position to the releasing position through the guide chamfer 113. Next, the latching member 130 enters into the accommodation space, the formerly compressed first elastic member 120 under a force elastically recovers to the initial state because of the releasing of the force, and pushes the first fastener 110 to return to the fixing position. The latching member 130 is limited in the accommodation space due to the stopping of the stopping portion 111 returning to the initial position, such that the circuit board 220 is positioned on the case 210, and cannot move towards the release direction.

Figure 5A:
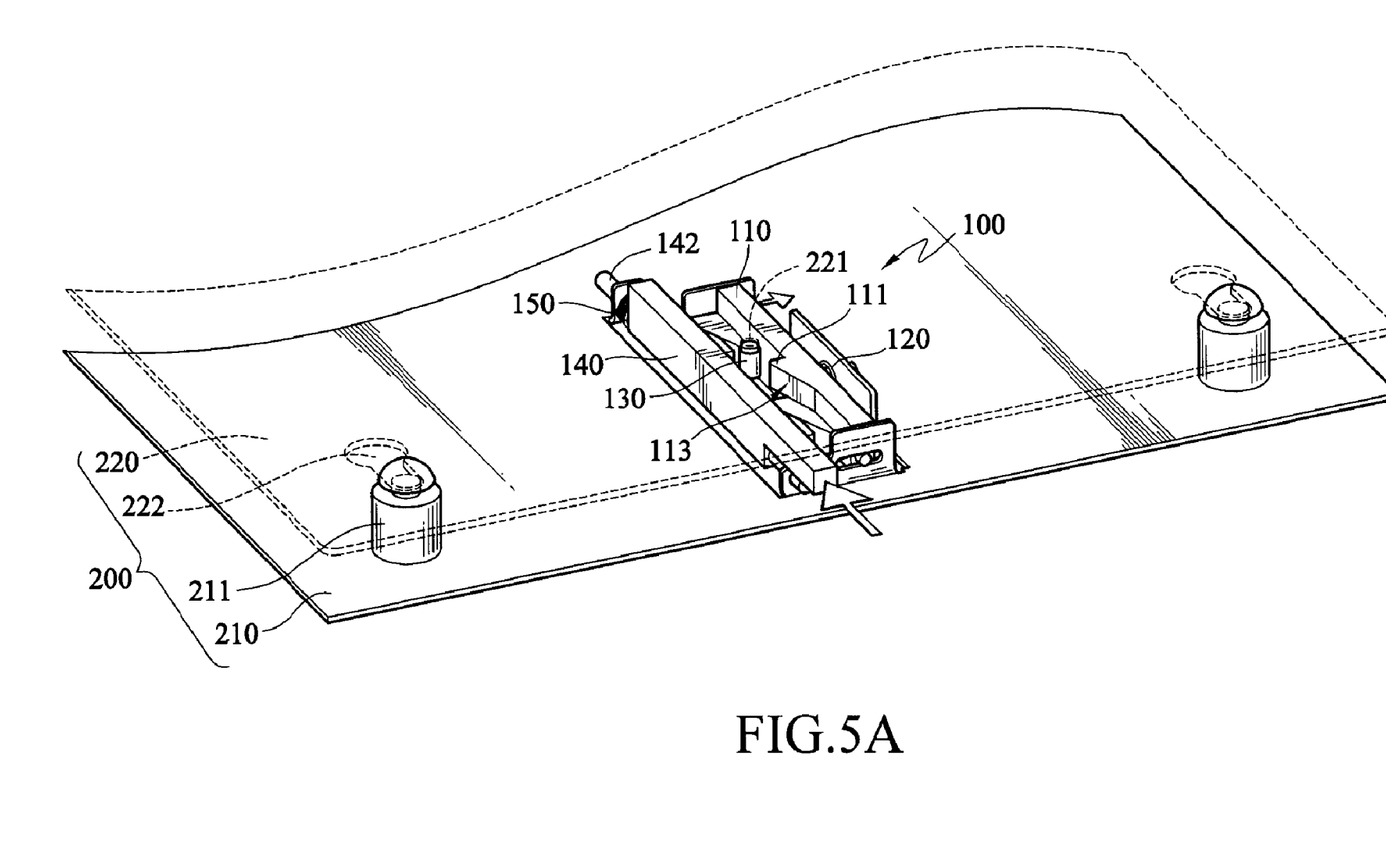
FIG. 5A is a perspective view of the present invention in a releasing state.
Figure 5B:
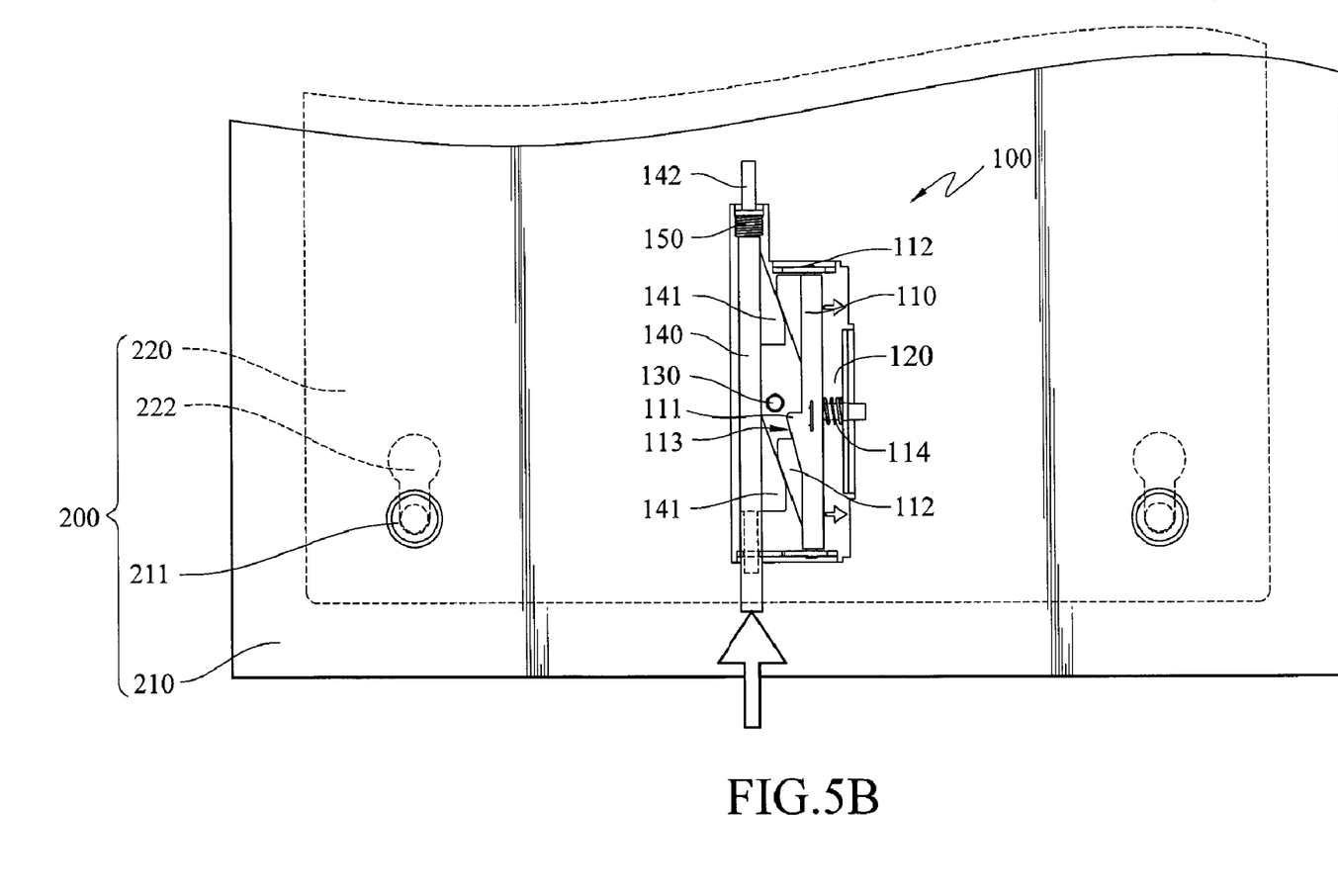
FIG. 5B is a top view of the present invention in the releasing state.

Please refer to FIGS. 5A and 5B, perspective schematic views of the circuit board in a releasing state are shown. When it intends to detach the circuit board 220 from the case 210, the second fastener 140 is pushed to shift relative to the first fastener 110 towards the integrate direction, such that the second pushing portion 141 pushes the first pushing portion 112, and the first fastener 110 shifts from the fixing position to the releasing position. The latching member 130 shifts along the release direction to separate from the accommodation space, and the combination post 211 is loosed from the combination hole 221, so as to detach the circuit board 220 from the case 210.

The first fastener provided by the present invention is used to stop the latching member, such that the circuit board is stably mounted on the case. The second fastener is used to push the first fastener, so as to detach the circuit board from the case. It is not necessary for the user to fix the circuit board with a plurality of groups of bolts, thereby really achieving the purpose of combining the circuit board on the case in the screwless manner, enabling the users to mount and dismount the circuit board rapidly and easily, and greatly improving the convenience in operation.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A retention device, applied to an electronic device having a case and a circuit board, wherein the circuit board shifts relative to the case along a integrate direction or a release direction, so as to get caught by the case or be detached from the case, and the circuit board is fixed on the case through the retention device, comprising:
    a first fastener, movably disposed on the case and moving between a fixing position and a releasing position, wherein a stopping portion and at least one first pushing portion are disposed at one side of the first fastener, and a moving direction of the first fastener forms an angle with the integrate direction or the release direction;
    a first elastic member, disposed on the case, leaning against one side of the first fastener, and normally maintaining the first fastener at the fixing position;
    a latching member, disposed on one side of the circuit board facing to the first fastener, the latching member shifting with the circuit board along the integrate direction, and pushing the first fastener to shift, and stopped by the stopping portion to position the circuit board on the case; and
    a second fastener, movably disposed on the case, and having a moving direction offset to the moving direction of the first fastener, wherein at least one second pushing portion contacting with the first pushing portion is disposed at one side of the second fastener, and a contacting surface of the first pushing portion and the second pushing portion forms an angle with the moving direction of the first fastener, such that the second pushing portion pushes the first pushing portion to make the first fastener shift from the fixing position to the releasing position.

2. The retention device as claimed in claim 1, wherein a guide chamfer is further disposed at one side of the first fastener, so as to guide the latching member to push the first fastener to shift.

3. The retention device as claimed in claim 1, wherein a first pin is further disposed at one side of the first fastener, and the first elastic member is sleeved on the first pin, such that the first elastic member normally pushes the first fastener.

4. The retention device as claimed in claim 1, further comprising a second elastic member disposed on the case, leaning against one end of the second fastener, wherein the second elastic member normally pushes the second fastener, such that the first fastener maintains at the fixing position.

5. The retention device as claimed in claim 4, wherein a second pin is further disposed at one end of the second fastener, and the second elastic member is sleeved on the second pin, such that the second elastic member normally pushes the second fastener.

6. The retention device as claimed in claim 1, wherein the moving direction of the first fastener is perpendicular to the integrate direction or the release direction.

7. The retention device as claimed in claim 1, wherein a bump is further disposed at the latching member, a combination portion corresponding to the bump is disposed on one side of the circuit board, and the bump and the combination portion are engaged to each other, such that the latching member is secured on the circuit board.

8. The retention device as claimed in claim 1, wherein at least one combination hole is disposed at the circuit board, and at least one combination post is disposed at the case, and the combination hole and the combination post are combined to each other, such that the circuit board gets caught by the case.

* * * * *